US006329254B1

(12) United States Patent
Cremonesi et al.

(10) Patent No.: US 6,329,254 B1
(45) Date of Patent: Dec. 11, 2001

(54) MEMORY CELL OF THE EEPROM TYPE HAVING ITS THRESHOLD ADJUSTED BY IMPLANTATION, AND FABRICATION METHOD

(75) Inventors: Carlo Cremonesi, Vaprio d'Adda; Bruno Vajana, Bergamo; Roberta Bottini, Lissone; Giovanna Dalla Libera, Monza, all of (IT)

(73) Assignee: STMicroelectronics S.r.l., Agrate Brianze (IT)

( * ) Notice: Subject to any disclaimer, the term of this patent is extended or adjusted under 35 U.S.C. 154(b) by 0 days.

(21) Appl. No.: 09/431,301

(22) Filed: Oct. 29, 1999

(30) Foreign Application Priority Data

Oct. 30, 1998 (IT) ................................ MI98A2334

(51) Int. Cl.$^7$ .................................................. H01L 21/326
(52) U.S. Cl. ........................................... 438/289; 438/276
(58) Field of Search ..................... 438/257, 262, 438/258, 585, 45, 48, 174, 194, 217, 289, FOR 205

(56) References Cited

U.S. PATENT DOCUMENTS 5,486,487 * 1/1996 Ginami et al. ......................... 437/45
5,908,311 * 6/1999 Chi et al. ............................ 438/258

* cited by examiner

Primary Examiner—Matthew Smith
Assistant Examiner—Calvin Lee
(74) Attorney, Agent, or Firm—Lisa Jorgenson; Robert Iannucci; Seed IP Law Group, PLLC

(57) ABSTRACT

A process formes a structure incorporating at least one circuitry transistor and at least one non-volatile memory cell of the EEPROM type with two self-aligned polysilicon levels having a storage transistor and an associated selection transistor in a substrate of semiconductor material including field oxide regions bounding active area regions. The process comprises the steps of in the active area regions, forming a gate oxide layer and defining a tunnel oxide region included in the gate oxide layer depositing and partly defining a first polysilicon layer forming an interpoly dielectric layer and removing the interpoly dielectric layer at least at the circuitry transistor depositing a second polysilicon layer selectively etching away the second polysilicon layer at the cell, and the first and second polysilicon layers at the circuitry transistor and selectively etching away the interpoly dielectric layer and the first polysilicon layer at the cell. After forming and before partially defining the first polysilicon layer, the process implants at least at the channel region of the floating-gate storage transistor for adjusting the transistor threshold.

17 Claims, 4 Drawing Sheets

MEMORY CELL OF THE EEPROM TYPE HAVING ITS THRESHOLD ADJUSTED BY IMPLANTATION, AND FABRICATION METHOD

TECHNICAL FIELD

This invention relates to a memory cell of the EEPROM type, in particular of the FLOTOX EEPROM type, having its threshold adjusted by implantation, and to a method of fabricating it.

BACKGROUND OF THE INVENTION

As is well known, the use of non-volatile memories of the EEPROM type as data storage devices is expanding by virtue of a specific feature of such memories whereby the information contained in the individual memory cells can be modified electrically in use, at both the writing and the erasing phases, in an independent, selective manner. For that purpose, a selection transistor is associated in series with each cell.

Consistently with today's technology, such storage devices rate very high in terms of reliability.

Concurrently therewith, there is a persistent demand for high capacity (at least 256 Kb) storage devices, incorporating an ever larger number of cells per memory unit. In this direction, the technology of electronic semiconductors is moving toward ever larger integration scales, and an attendant reduction in component size. This involves, however, a more critical control of their characteristics, and increased difficulty to ensure reliable performance of such advanced cells fabricated to a very large scale of integration (ULSI).

Typically, non-volatile memory cells are integrated in a substrate of a semiconductor material and laid into rows and columns to form a matrix of cells. The cell element wherein the information is stored is a MOS transistor of the floating gate type. The logic state, or level, of the cell is defined by the amount of charge contained in the floating gate of the transistor.

In particular, the amount of charge is altered in EEPROMs by causing charges to flow by tunnel effect (known as Fowler-Nordheim current) through a thin layer of silicon oxide, the so-called tunnel oxide, which intervenes between the substrate of semiconductor material and the floating gate of the transistor.

Of the various types of EEPROMs, reference will be made here to those having two levels of polysilicon. Their associated memory cells comprise each a floating gate of polysilicon overlying a layer of gate oxide which is formed on top of a silicon substrate, and a control gate, also of polysilicon, overlying the floating gate and being isolated from the latter by a so-called interpoly dielectric layer.

The selection transistor associated with a cell can be variously constructed; for example, it consists of either a single layer of polysilicon or two superposed layers of polysilicon provided above a gate oxide, with an interpoly dielectric layer optionally interposed. Where no interpoly dielectric is provided, it becomes known as a short-circuited double polysilicon construction. Where the interpoly dielectric is provided, a short-circuit must be established all the same between the two layers in appropriate areas of the device, either outside or inside the memory matrix.

In addition, circuitry transistors are usually provided in the device which may have a single polysilicon or double polysilicon, and no interpoly dielectric layer. This specification makes reference in particular to the last-mentioned instance, by way of example.

The aforementioned storage structures can be fabricated with technologies that provide for alignment of the control gate to the floating gate. Examples of such processes can be found in US Patent US-4,719,184 and European Patent EP-0255159.

One widely employed structure of EEPROM cells with a double level of polysilicon, known as FLOTOX, provides for the floating gate to be extended laterally outside the tunnel oxide region.

A single memory cell of the FLOTOX type with a double level of polysilicon formed by a standard technique is described in US Patents U.S. Pat. No. 5,793,673 and U.S. Pat. No. 5,792,670, for example. A cross-sectional view of this is given in FIG. 1.

By way of example only, the cell is made with CMOS technology.

Referring to this Figure, the memory cell, generally referenced 1, comprises a series of a floating gate transistor 2 and a selection transistor 3, both of the MOS type, represented in an active area region of a substrate 4 having a first type of conductivity. The cross-section is taken in a parallel direction to the matrix columns, in particular along a source/drain line of the matrix of cells.

The floating gate transistor includes a tunnel oxide region 5 surrounded by a layer 6 of gate oxide. An overlying first layer 7 of polysilicon forming the floating gate, and a second layer 8 of polysilicon forming the control gate, are isolated electrically by an interpoly dielectric layer 9. The latter is usually a triple layer of oxide/nitride/oxide, or ONO, optionally overlaid with a thin layer of polysilicon, the so-called "polino". A low-resistivity silicide layer, not shown in the Figure, is usually provided on top of the second polysilicon layer 8.

The selection transistor 3 similarly includes a gate dielectric 11 which is overlaid by the first and second polysilicon layers 7 and 8, with the interpoly dielectric layer 9 lying therebetween.

Source and drain active regions of both transistors, having a second type of conductivity, are shown at 12, 13 and 14. In the storage transistor 2, they define a channel region 15 that includes specifically a tunnel area 15' underlying the tunnel oxide region 5. These memories further requires a doped continuity region 16 with a second type of conductivity which is typically formed by implantation, known as the capacitor implant, and extends from the tunnel area to over the drain region 13 to ensure electrical continuity between the substrate region lying beneath the tunnel oxide (tunnel area 15') and the drain region 13 of the cell during its operation.

As can be seen in the Figure, the two polysilicon layers are aligned along the source/drain direction in both the floating gate transistor 2 structure and that of the selection transistor 3.

Referring to FIGS. 2–5, some steps are illustrated therein of a CMOS process which adopts a so-called DPCC (short-circuited double poly) flow for making a memory cell of the EEPROM type and a transistor of the external circuitry to the matrix, as is known in the art. It should be noted that both high-voltage or HV transistors, i.e., transistors capable of sustaining high voltages, and low-voltage or LV transistors, i.e., transistors operated at relatively low voltages, are typically formed in the circuitry. They distinguish themselves by the thickness of their gate oxide layer. However, a generic transistor, representing either an LV or a HV transistor, is shown by way of example in the drawings.

The drawings are cross-sectional views taken along the same section line as indicated in FIG. 1.

After defining the active areas, the substrate 4 is grown gate oxide layers 17 and 11 thereon, in the regions of the transistors of the circuitry 20 and the selection transistors 3, as well as a gate oxide layer 6 in the region of the storage transistor 2. Also defined is the tunnel oxide region 5 at the floating gate to be formed. The first polysilicon layer 7 is deposited and doped by implantation (FIG. 2). It is then partially defined using a mask apertured at the region 2 in planes outside the drawings and not represented.

The interpoly dielectric layer 9 and a thin polysilicon layer 21 are then deposited. The last-mentioned layer provides protection for the underlying interpoly dielectric during the next masking step. At this stage, as shown in FIG. 3, a selective etching step is carried out to remove the thin polysilicon layer 21 and the underlying interpoly dielectric layer 9, in those regions of the storage device where the external circuitry is to be formed, using a mask 22 which leaves the portion destined for the cell matrix covered. More generally, this mask covers the device regions intended to accommodate circuit elements with a DPCC structure.

The following step, not illustrated, includes implanting the transistors in the circuitry to define their threshold, the so-called Low Voltage Shift (LVS) implant, e.g., by implantation of a dopant such as boron. This is a low-energy light-dosage implantation. No mask is needed in the matrix because the interpoly dielectric layer provided therein will screen off the low-energy implant, specifically by the presence of nitride.

Thereafter, the second polysilicon layer 8 and a silicide layer 23 are deposited. A selective etching step is then carried out using the mask 24. During this step, illustrated by FIG. 4, the silicide layer 23, second polysilicon layer 8, and thin polysilicon layer 21 in the matrix are removed, while from the circuitry, only the silicide layer 23 and the second and first polysilicon layers 7 and 8 are removed, there being no interpoly dielectric layer present.

At this stage (FIG. 5), without removing the previous mask 24, a self-aligned etching step is carried out through the intermediate dielectric layer 9 and the first polysilicon layer 7 in the matrix, using a double-resist mask 25. Thus, the cell structure, including the selection transistor, is completely defined in a self-aligned manner. The mask 25 fully exposes the matrix region where the two polysilicon layers are not short-circuited, while fully masking the circuitry region defined during the previous step.

In an advanced process like that just described, whereby the overall size of the memory structure is greatly reduced, a critical factor of current technologies is control of the threshold value of the data storage transistor. In fabricating integrated circuits with methods of the CMOS type, whereto the present invention specifically relates, it is particularly difficult to establish a low threshold voltage with a small gap between the drain and source active regions.

It should recalled in this respect that non-volatile memories of a standard type are programmed in either of two logic states, namely written and erased, "0" and "1", to store in one bit per cell. A different level of the threshold voltage corresponds to each of them. The cell programming, i.e., the storing of electric charges in the floating gate region, depresses the cell threshold level. Subsequent erasing of the cell raises its threshold back to its value. The state of a virgin cell corresponds to a voltage level intermediate those of an erased cell and of a written cell.

The threshold values are determined by the cell structure, as well as by construction features and properties of the materials comprising it. In a standard memory cell, reading the threshold value of a virgin cell may cause trouble at the programming stage. In particular, the problem is one of being able to adjust the threshold value of a virgin cell such that it can be read as if it were a written cell or an erased cell, according to the specific requirements of the device which is to include it.

SUMMARY OF THE INVENTION

In the light of the foregoing, it is an object of this invention to provide a process for fabricating an EEPROM cell which allows the threshold voltage of the cell to be adjusted without introducing added complications or costs.

A most effective solution looked at here is that of adding a memory cell implanting step, so that its threshold could be adjusted as appropriate. It should be considered that the threshold jump between written and erased cell, which represents the range through which the cell is operated in its life, becomes smaller when the device is tested for reliability. Accordingly, it should be possible to sufficiently discriminate a virgin threshold value from those of an erased and written cell.

It should be further noted that, in current process flows for manufacturing ever more sophisticated devices, the device complexity and accuracy usually involve a need for additional process steps, which is at issue with the urge to keep manufacturing costs as low as possible.

An embodiment of this invention provides a self-aligned method of forming an integrated structure which comprises non-volatile memory cells of the EEPROM type with a double level of polysilicon and an associated selection transistor in a substrate of semiconductor material. The memory cell includes a storage transistor having a control gate overlying and being isolated from a floating gate which is coupled, by tunnel oxide, to a tunnel area provided in said substrate and included in a channel region with a first type of conductivity interposed between first and second active regions with a second type of conductivity. In addition, a region of electrical continuity having a second type of conductivity extends from said tunnel area to partly overlie said first active region.

The process of this invention provides for an implanting operation to be carried out at least in the channel region of the floating-gate storage transistor to adjust the transistor threshold.

According to this invention, the threshold of the storage transistor can be modified by implantation through the first polysilicon layer. In this way, an implantation of the LVS type, as already provided in the process, can be utilized. Preferably, the same mask is used as is later exposed for the self-aligned etching of the cell.

BRIEF DESCRIPTION OF THE DRAWINGS

The features and advantages of this invention will become more clearly apparent from the detailed description of an embodiment thereof, illustrated by way of example and not of limitation in companying drawings.

DETAILED DESCRIPTION OF THE INVENTION

A preferred process for forming memory cells of the EEPROM type and external-circuitry transistors is illustrated by FIGS. 6–9 in relation to a self-aligned process of the CMOS DPCC type similar to that described in connection with the prior art and FIGS. 2–5.

Figure 1:
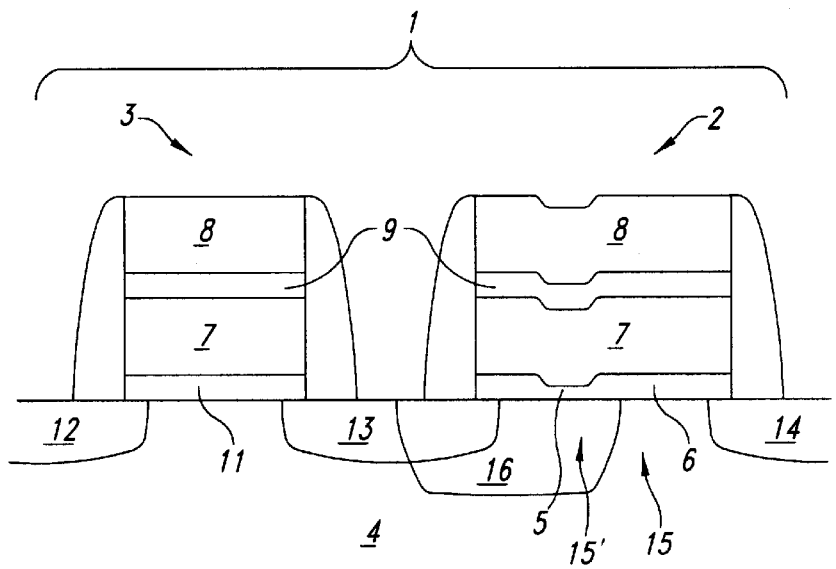
FIG. 1 shows an EEPROM non-volatile memory cell as formed by a conventional technique.
Figure 2:
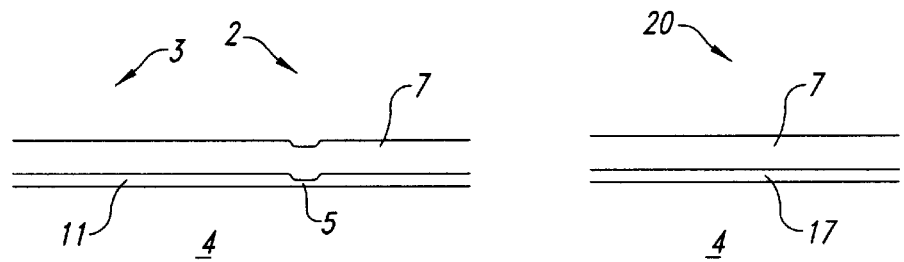
FIGS. 2–5 illustrate some significant steps of a process for forming an EEPROM non-volatile memory cell and an external-circuitry transistor by a conventional technique.
Figure 3:
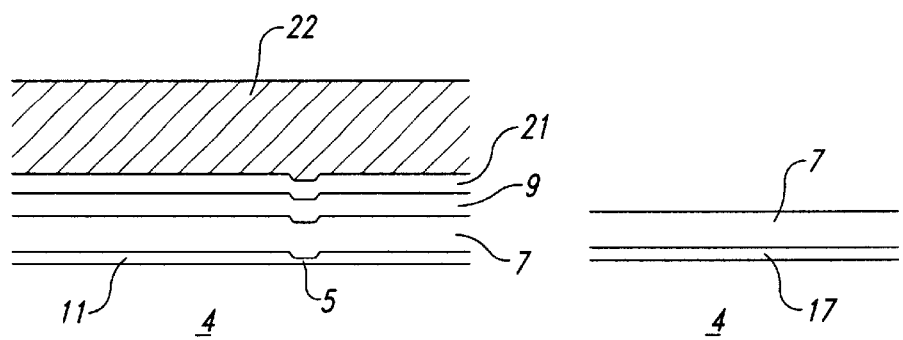
Figure 4:
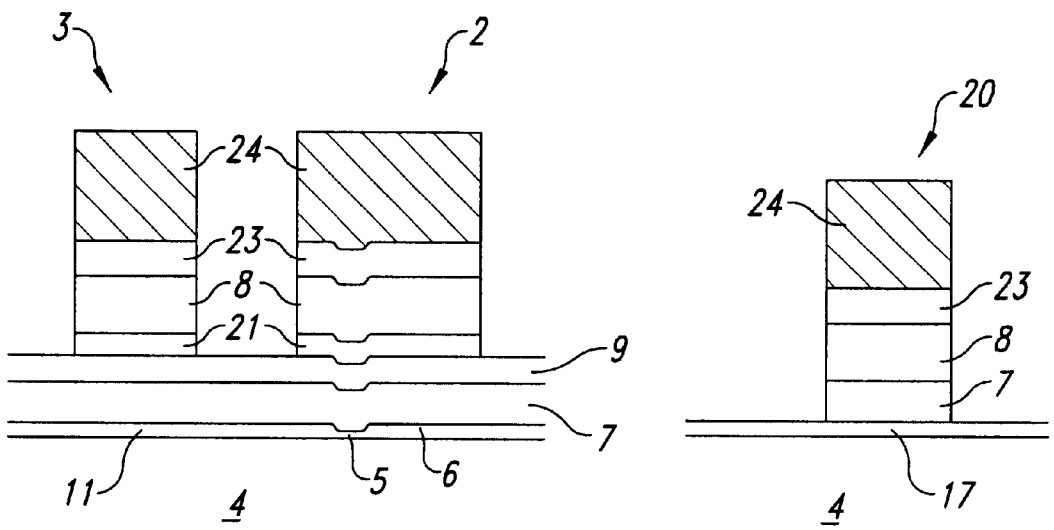
Figure 5:
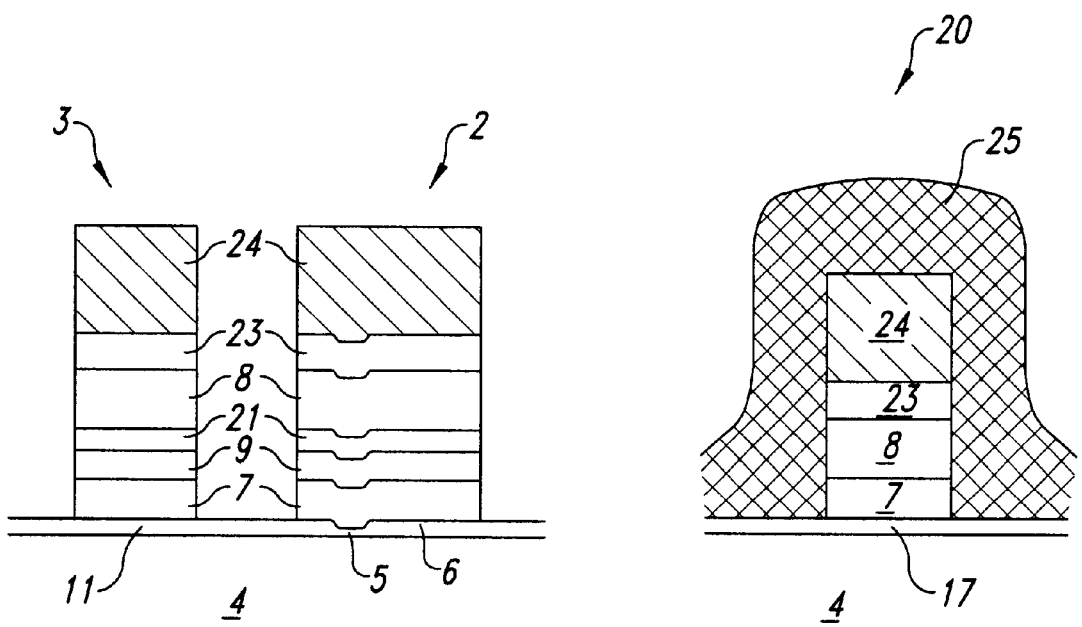
Figure 6:
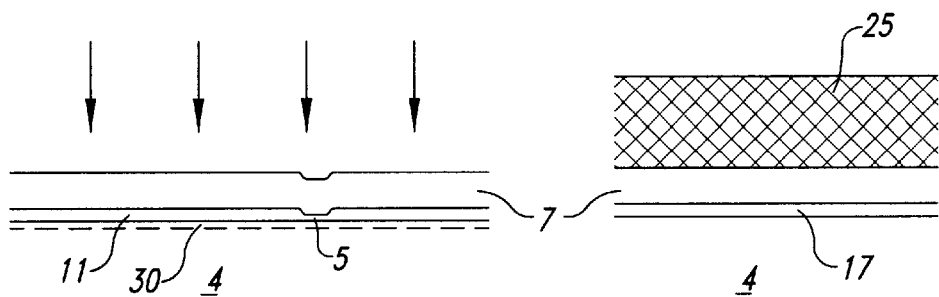
FIGS. 6–9 illustrate schematically some steps of a process for forming an EEPROM non-volatile memory cell and an external-circuitry transistor, according to this invention.

The process is run in a conventional flow up to the formation and associated implantation of the first polysilicon layer 7, similar to the showings of FIG. 6. The active oxides of the device, namely the gate oxides 11, 17 and tunnel oxide 5, are formed in active area regions bounded by field oxide regions, the latter being omitted from the drawings. Where at least two types of circuitry transistors, having different thickness gates, are simultaneously present, the process typically includes the steps of growing a first gate oxide; removing it throughout except from the high-voltage transistor areas; growing a second gate oxide to form the gate oxides for both transistor types; removing the oxides from the tunnel region; and growing the tunnel oxide.

A first polysilicon layer 7 is then formed by deposition in both the circuitry region and the matrix region.

In accordance with this invention, and as shown in FIG. 6, the self-aligned etching mask 25 is exposed in the region of the cell matrix, before defining the first layer of polysilicon. This mask 25 completely uncovers the region of the memory cell matrix, but covers the circuitry. An appropriate implantation is carried out through said mask, as indicated by arrows in FIG. 6, to allow the threshold voltage of the cell to be adjusted. Thus, a shallow region 30 is formed in the channel region 15, as indicated by the hatched area, wherein the dopant concentration is higher than in the substrate.

Advantageously, there is no need to design a mask specially for this, and a mask already provided in the process flow can be used instead, resulting in obvious savings.

The implant typically consists of dopant of the P type, boron ions in a preferred embodiment. The implanting operation is carried out at a light dosage, and the dopant reaches deeply enough to alter the cell threshold. The depth of the region 30 is preferably in the range of a few hundred Angstroms, typically of 200–300 Å. The implantation is performed through the polysilicon layer 7, similar to the LVS implantation to be carried out directly afterwards in order to modify the threshold of the circuitry transistors. It is for this reason that an implantation can be carried out advantageously which has the same dosage and energy characteristics as the LVS implantation. In one embodiment, the implanting energy is selected in the 50 KeV range.

It should be noted that low implanting energy can be used because the implantation is performed through the polysilicon layer 7.

Figure 7:
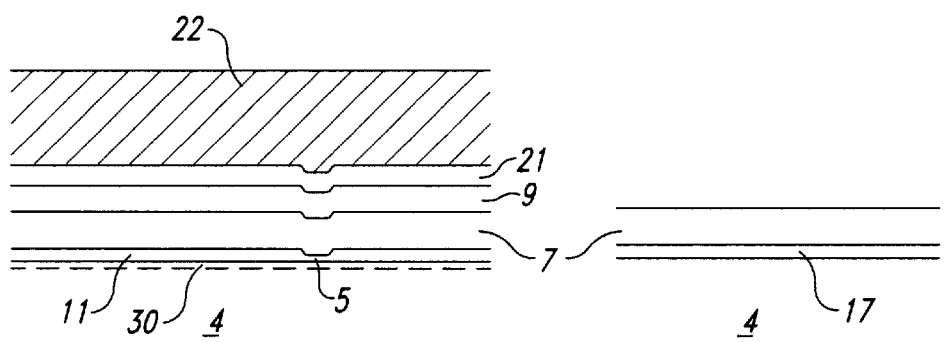
Figure 8:
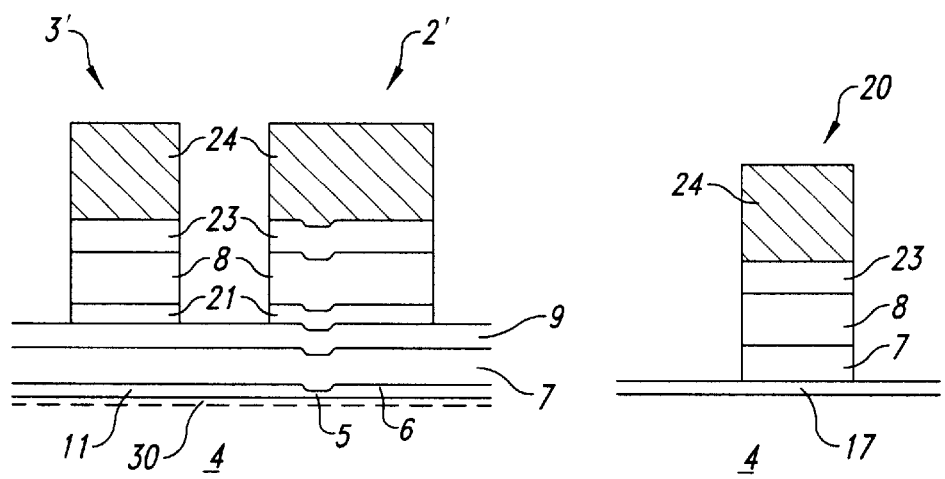
Figure 9:
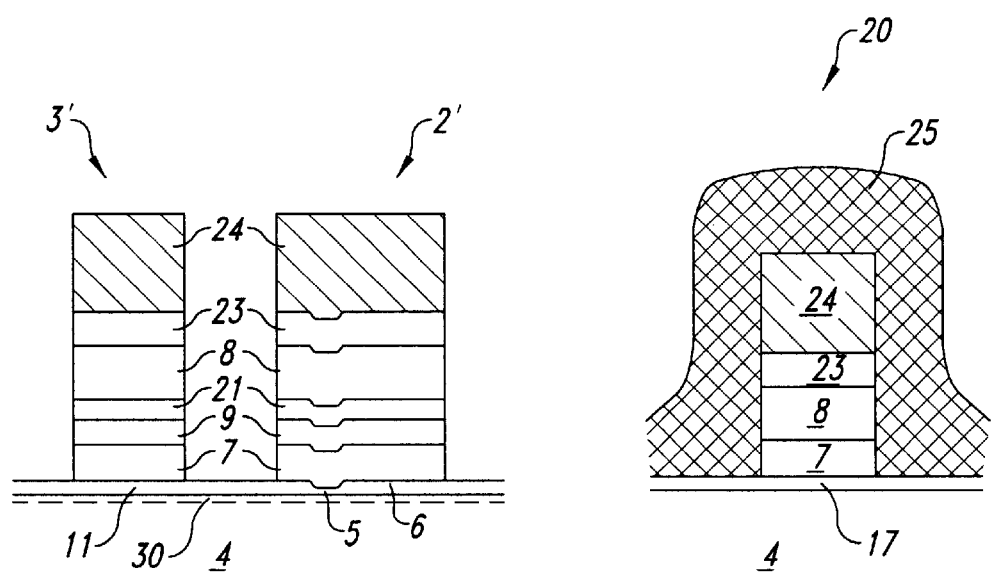

The subsequent fabrication steps, shown in FIGS. 7, 8 and 9, are left unchanged with respect to the state of the art, and include defining the first polysilicon layer 7 along a parallel direction to the source line in the region of the cell matrix; forming the interpoly dielectric layer 9 and the thin polysilicon layer 21; removing said two layers from the region of the external circuitry using the mask 22 (FIG. 7); LVS implanting the transistors of the circuitry 20; depositing and doping the second polysilicon layer 8 and, preferably, forming the silicide layer 23; defining the silicide layer 23, second polysilicon layer 8, and thin polysilicon layer 21 in the matrix area, while at the same time defining said layers 23, 8, 21 and the first polysilicon layer 7 in the circuitry region (FIG. 8); and etching away, self-aligned to the second polysilicon layer 8, the first polysilicon layer 7 in the region of the matrix cell 2' and 3' using the mask 25 (FIG. 9).

The process is then carried to completion through the standard implanting steps, the steps of forming sidewall oxide spacers, depositing a dielectric insulating layer, and forming contact openings and the metallization layers.

The FIGS. show that the cell has a shallow implant 30 across its active area, at both the floating-gate storage transistor 2' and the selection transistor 3'.

It has been assumed in the foregoing description that the two polysilicon layers in the selection transistor were not short-circuited (non-DPCC). However, a similar process would be applicable to a DPCC type of selection transistor as well, once the masks 22 and 25 are suitably modified. In this case, according to the invention, by using the selfaligned mask for the implantation, the selection transistor can be prevented from being implanted, thereby achieving better control of its threshold and the so-called body effect.

Figure 10:
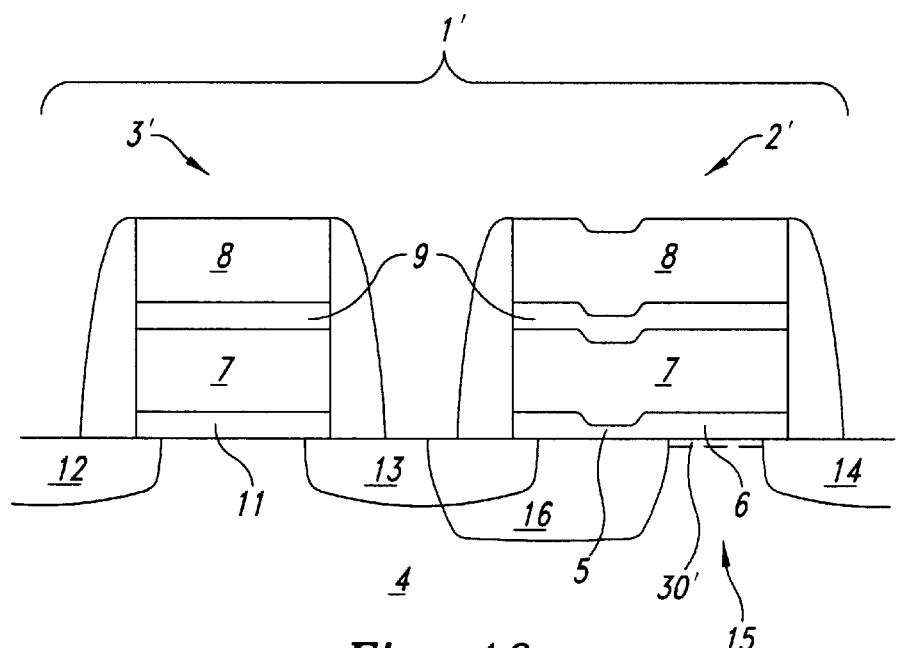
FIG. 10 shows a cross-section through an EEPROM cell at the final stage of its fabrication according to one embodiment of this invention.

FIG. 10, showing a cross-section through memory cell 1', i.e., the storage transistor 2' and the selection transistor 3', illustrates an exemplary device as obtained with this alternative process, for example. It can be seen that, in the finished structure of the cell, the implant, shown at 30', only locates at the channel of the floating-gate storage transistor 2'.

It should be understood that changes and modifications can be made unto the process described herein, all within the scope of the present invention as defined in the appended claims.

What is claimed is:

1. A process for forming a structure incorporating at least one circuitry transistor and at least one non-volatile memory cell of the EEPROM type with two self-aligned polysilicon levels having a storage transistor and an associated selection transistor in a substrate of semiconductor material including field oxide regions bounding active area regions, comprising the steps of:

in said active area regions, forming a gate oxide layer and defining a tunnel oxide region included in said gate oxide layer;

depositing and partly defining a first polysilicon layer;

forming an interpoly dielectric layer and removing said interpoly dielectric layer at least at said circuitry transistor;

depositing a second polysilicon layer;

selectively etching away said second polysilicon layer at said cell and said first and second polysilicon layers at said circuitry transistor;

selectively etching away said interpoly dielectric layer and said first polysilicon layer at said cell;

after forming and before partially defining said first polysilicon layer, implanting dopants completely through the first polysilicon layer into the substrate at least at a channel region of the storage transistor, thereby forming a doped channel region for adjusting a threshold of the storage transistor.

2. A process according to claim 1 wherein said step of selectively etching away said interpoly dielectric layer and said first polysilicon layer at said cell comprises using a mask to cover at least the circuitry transistor, and said implanting step is carried out through said mask.

3. A process according to claim 1, further comprising implanting a dopant in a region of the circuitry transistor to adjust the threshold of said circuitry transistor wherein the step of implanting a dopant at the channel region of the storage transistor is carried out at the same dosage and the same energy as said step of implanting dopant in the region of the circuitry transistor.

4. A process according to claim 3, wherein said implanting steps are carried out at relatively low energy, below 150 KeV.

5. A process according to claim 1 wherein said implanting step is carried out using a dopant of the P type.

6. A process according to claim 5, wherein said implanting step is carried out using boron ions.

7. The process according to claim 1 wherein the implanting step includes implanting dopants into the substrate at the selection transistor and the storage transistor.

8. A process for forming an integrated nonvolatile memory cell having a storage transistor and an associated selection transistor, the process comprising:

forming a gate oxide layer on a semiconductor substrate;

defining a tunnel oxide region in the gate oxide layer;

depositing and partly defining a first polysilicon layer on the gate oxide layer and tunnel oxide region;

forming an interpoly dielectric layer on a portion of the first polysilicon layer at which the storage transistor is being formned;

depositing a second polysilicon layer on the interpoly dielectric layer;

after forming and before partially defining the first polysilicon layer, implanting dopants completely through the first polysilicon layer into the substrate at a channel region of the storage transistor, thereby forming a doped channel region for adjusting a threshold of the storage transistor.

9. The process of claim 8 wherein the implanting step includes implanting dopants into the substrate at the selection transistor and the storage transistor.

10. The process of claim 8 wherein the first and second polysilicon layers and the interpoly dielectric layers are formed on a portion of the gate oxide layer at which the selection transistor is being formed.

11. The process of claim 8, further comprising selectively etching away the interpoly dielectric layer and the first polysilicon layer at the cell using a mask that cover a circuitry transistor being formed on the substrate, wherein the implanting step is carried out through the mask.

12. The process of claim 8 wherein the steps of depositing the first and second polysilicon layers include depositing the first and second polysilicon layer at a circuitry transistor being formed in the substrate, the process further comprising implanting dopants in a region of the circuitry transistor to adjust the threshold of the circuitry transistor wherein the step of implanting dopants at the channel region of the storage transistor is carried out at a same dosage and a same energy as the step of implanting dopants in the region of the circuitry transistor.

13. The process of claim 12 wherein the implanting steps are carried out at relatively low energy, below 150 KeV.

14. The process of claim 8 wherein the interpoly dielectric layer and the second polysilicon layer are deposited after implanting dopants through the first polysilicon layer and before the first polysilicon layer is partially defined.

15. The process of claim 14 wherein the gate oxide layer, first and second polysilicon layers, and interpoly dielectric layer are selectively defined to produce a gate for the selection transistor and a gate for the storage transistor.

16. The process of claim 8 wherein the implanting step is carried out using dopants of the P type.

17. The process of claim 16 wherein the implanting step is carried out using boron ions.

* * * * *

UNITED STATES PATENT AND TRADEMARK OFFICE
CERTIFICATE OF CORRECTION

PATENT NO. : 6,329,254 B1
DATED : December 11, 2001
INVENTOR(S) : Carlo Cremonesi et al.

It is certified that error appears in the above-identified patent and that said Letters Patent is hereby corrected as shown below:

<u>Title page,</u>
Item [73], "Agrate Brianze (IT)" should read as -- Agrate Brianza (IT) --.

<u>Column 7,</u>
Line 24, "being formned;" should read as -- being formed; --.

Signed and Sealed this

Twenty-first Day of May, 2002

*Attest:*

*Attesting Officer*

JAMES E. ROGAN
*Director of the United States Patent and Trademark Office*